United States Patent
Li et al.

(10) Patent No.: US 6,972,239 B1
(45) Date of Patent: Dec. 6, 2005

(54) LOW TEMPERATURE MOCVD PROCESSES FOR FABRICATION OF $PR_XCA_{1-X}MNO_3$ THIN FILMS

(75) Inventors: Tingkai Li, Vancouver, WA (US); Wei-Wei Zhuang, Vancouver, WA (US); Lawrence J. Charneski, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/923,529

(22) Filed: Aug. 20, 2004

(51) Int. Cl.[7] .............................................. H01L 21/20
(52) U.S. Cl. ...................... 438/384; 438/240; 438/681
(58) Field of Search ................................ 438/384, 240, 438/680, 681, 785, 911, 913

(56) References Cited

U.S. PATENT DOCUMENTS

| | | | |
|---|---|---|---|
| 6,204,139 B1 | 3/2001 | Liu et al. | |
| 6,673,691 B2 | 1/2004 | Zhuang et al. | |
| 6,911,361 B2 * | 6/2005 | Zhang et al. | 438/240 |
| 2004/0170761 A1 * | 9/2004 | Li et al. | 427/255.28 |
| 2004/0180507 A1 * | 9/2004 | Zhang et al. | 438/385 |

OTHER PUBLICATIONS

Liu et al., *Electric-pulse-induced reversible resistance change effect in magnetoresistive films*, Applied Physics Letters, vol. 76, No. 19; May 8, 2000, pp 2749-2751.

U.S. Appl. No. 10/377,244, filed Feb. 27, 2003, Zhuang et al.

* cited by examiner

*Primary Examiner*—David Nhu
(74) *Attorney, Agent, or Firm*—David C. Ripma; Joseph P. Curtin

(57) ABSTRACT

A method of fabricating a PCMO thin film at low temperature for use in a RRAM device includes preparing a PCMO precursor; preparing a substrate; placing the substrate into a MOCVD chamber; introducing the PCMO precursor into the MOCVD chamber to deposit a PCMO thin film on the substrate; maintaining a MOCVD vaporizer at between about 240° C. to 280° C. and maintaining the MOCVD chamber at a temperature of between about 300° C. to 400° C.; removing the PCMO thin-film bearing substrate from the MOCVD chamber; and completing the RRAM device.

10 Claims, 5 Drawing Sheets

RESISTANCE CHANGE(2428, MOCVD,
WRITE: 5V 500ns, RESET: -5V 500ns, READ: 0.8V)

LOW TEMPERATURE MOCVD PROCESSES FOR FABRICATION OF PR$_x$CA$_{1-x}$MNO$_3$ THIN FILMS

FIELD OF THE INVENTION

This invention relates to processes and fabrication of Resistive Random Access Memory devices (RRAM), and specifically to a method to deposit Pr$_x$Ca$_{1-x}$MnO$_3$ (PCMO) thin film materials for RRAM applications using liquid delivery MOCVD techniques.

BACKGROUND OF THE INVENTION

Pr$_{0.3}$Ca$_{0.7}$MnO$_3$ (PCMO) metal oxide thin films, which show reversible resistance change via applying electric pulse, have been grown on both epitaxial YBa$_2$Cu$_3$O$_7$ (YBCO) and partial epitaxial platinum substrates via pulsed laser ablation (PLA) technique as described by Shangqing Liu et al., in *Electric-pulse-induced reversible resistance change effect in magnetoresistive films*, Applied Physics Letters, Vol. 76, number 19, pp. 2749, May 2000; and in U.S. Pat. No. 6,204,139 B 1, granted Mar. 20, 2001, for *Method for switching the properties of perovskite materials used in thin film resistors*. In U.S. Pat. No. 6,673,691, granted Jan. 6, 2004, for *Method for Reversible Resistance Change Induced by Short Electric Pulses*, a method of spin-coating PCMO thin film deposition technique is described to fabricate a reversible resistance switch using a unipolar electric pulse. In co-pending U.S. patent application Ser. No. 10/377,244, filed Feb. 27, 2003, for *Precursor Solution and Method for Controlling the Composition of MOCVD Deposited PCMO*, a PCMO thin film, having reversible resistance properties, is formed by MOCVD.

Liu et al., supra, discovered a resistance change in a PCMO film by applying bipolar electric pulses at room temperature, specifically for a Pr$_{0.3}$Ca$_{0.7}$MnO$_3$ (PCMO) thin film. Liu et al. deposited PCMO thin films on epitaxial YBa$_2$Cu$_3$O$_7$ (YBCO) and on partial epitaxial platinum substrates by pulsed laser deposition (PLD).

Higher temperature processes result in many problems during process integration of RRAM devices, such as diffusion, poor thermal stability of electrodes, etc. Thus, a method of fabricating PCMO RRAM devices at lower temperature is desirable, in order to fabricate RRAM incorporating bipolar switching PCMO thin films.

SUMMARY OF THE INVENTION

A method of fabricating a PCMO thin film at low temperature for use in a RRAM device includes preparing a PCMO precursor; preparing a substrate; placing the substrate into a MOCVD chamber; introducing the PCMO precursor into the MOCVD chamber to deposit a PCMO thin film on the substrate; maintaining a MOCVD vaporizer at between about 240° C. to 280° C. and maintaining the MOCVD chamber at a temperature of between about 300° C. to 400° C.; removing the PCMO thin-film bearing substrate from the MOCVD chamber; and completing the RRAM device.

It is an object of the invention to fabricate a RRAM device having a PCMO switching thin film.

It is another object of the invention to fabricate a RRAM device having a PCMO switching thin film at a lower than conventional temperature.

A further object of the invention is to deposit crystallized PCMO thin films using enhanced surface nucleation.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Lower temperature deposition of Pr$_x$Ca$_{1-x}$MnO$_3$ (PCMO) thin film materials has many advantages for integration of Resistive Random Access Memory (RRAM) devices. However, only crystallized PCMO thin films demonstrate RRAM functional properties with bipolar switching. Therefore, optimized low temperature MOCVD processes to deposit crystallized PCMO thin films by using enhanced surface nucleation are advantageous.

Figure 1:
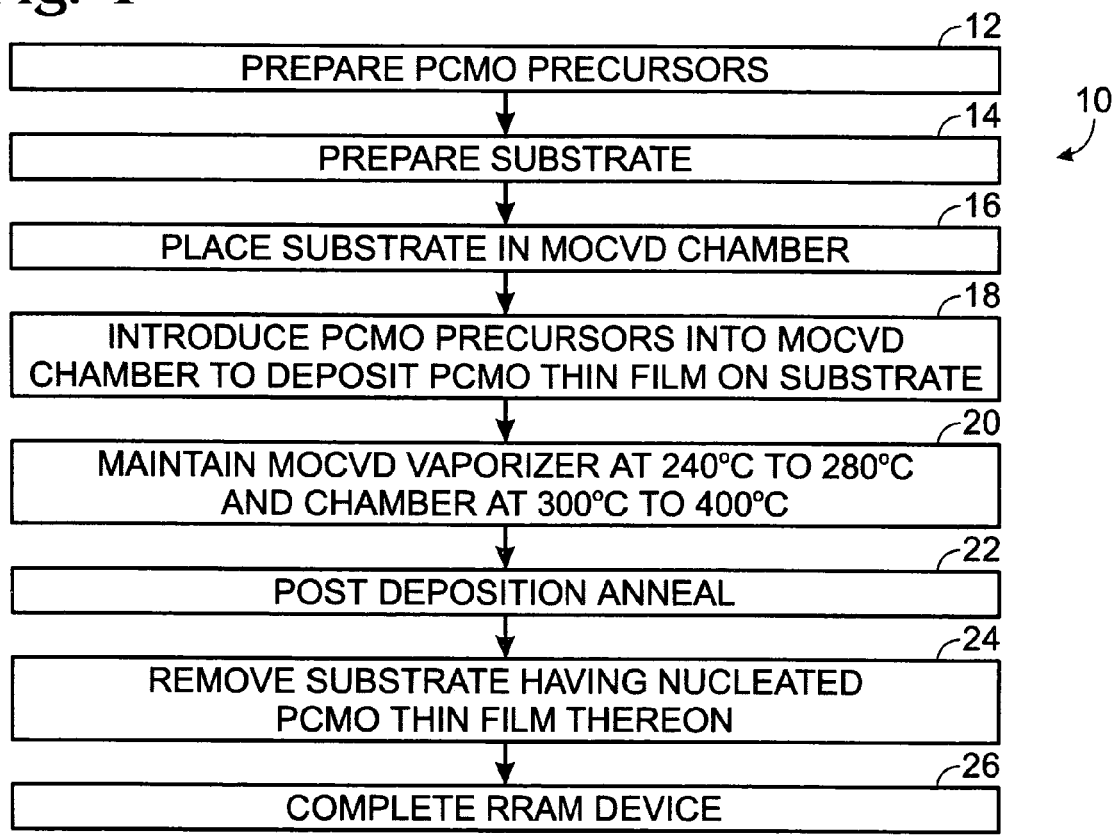
FIG. 1 is a block diagram of the method of the invention.

The following describes low temperature process 10 for optimization of MOCVD to deposit crystallized PCMO thin films by using enhanced surface nucleation, with reference to FIG. 1. The PCMO precursors are prepared 12 using solid organometallic compounds: Pr(thd)$_3$ Ca(thd)$_2$, Mn(thd)$_3$, where thd is C$_{11}$H$_{19}$O$_2$. The organic solvents are butylether and tetraglyme. The 1N metal of each Pr(thd)$_3$ Ca(thd)$_2$, Mn(thd)$_3$ with ratio of between about 0.9:0.6:1, are separately dissolved in a mixed solvent of butyl ether and tetraglyme in the volume ratio of 3:1. The precursor solutions have a concentration of 0.1 M/L of metals for each of the Pr, Ca and Mn precursors.

Substrate preparation 14 includes forming a substrate of either Pt/Ti/SiO$_2$/Si or Ir/Ti/SiO$_2$/Si, and dip etching the selected substrate in HF having a 50:1 dilution with water for about 20 seconds.

The substrate is placed in a MOCVD chamber 16, and the precursor solution introduced into the MOCVD chamber 18 to deposit a nucleated thin film of PCMO on the substrate. The PCMO precursor solution is injected into the vaporizer at temperature in a range of between about 240° C. to 280° C. A chamber oxygen partial pressure is maintained at between about 20% to 30%, the temperature of the feed line and vaporizer is set between about 240° C. to 280° C., and the temperature in the deposition chamber is maintained at between about 300° C. to 400° C., 20. The pressure in the deposition chamber is maintained at between about 1 torr. to 5 torr. The precursor solution has a delivery rate, into the MOCVD chamber, set by a liquid flow meter, of between about 0.1 ml/min to 0.5 ml/min, preferably at 0.4 ml/min, to form precursor vapors. The deposition process requires a time of between about 20 minutes to 60 minutes, depending on film thickness.

A post deposition annealing step includes annealing the PCMO thin film at a temperature of between about 500° C. to 600° C. for about five minutes in an oxygen atmosphere, 22.

Upon completion of the PCMO thin film deposition, the substrate is removed from the MOCVD chamber 24, and the RRAM device is completed according to state-of-the-art processes, 26.

The compositions of PCMO thin films are measured by EDX and phases of the PCMO thin films are identified using x-ray diffraction.

Figure 2:
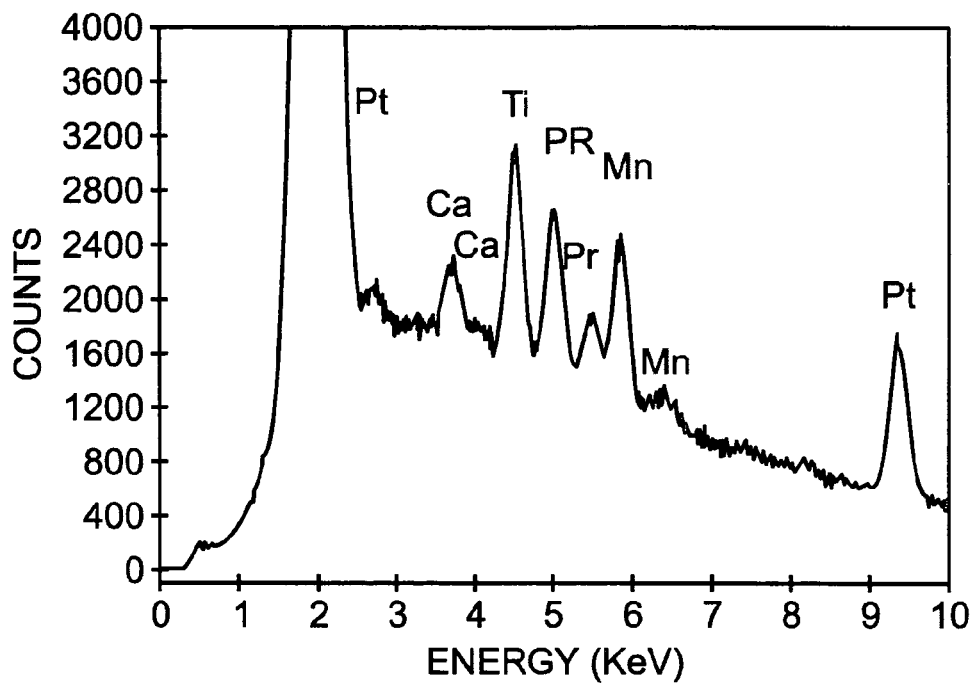
FIG. 2 is an EDX pattern of an as-deposited PCMO thin film fabricated according to the method of the invention.
Figure 3:
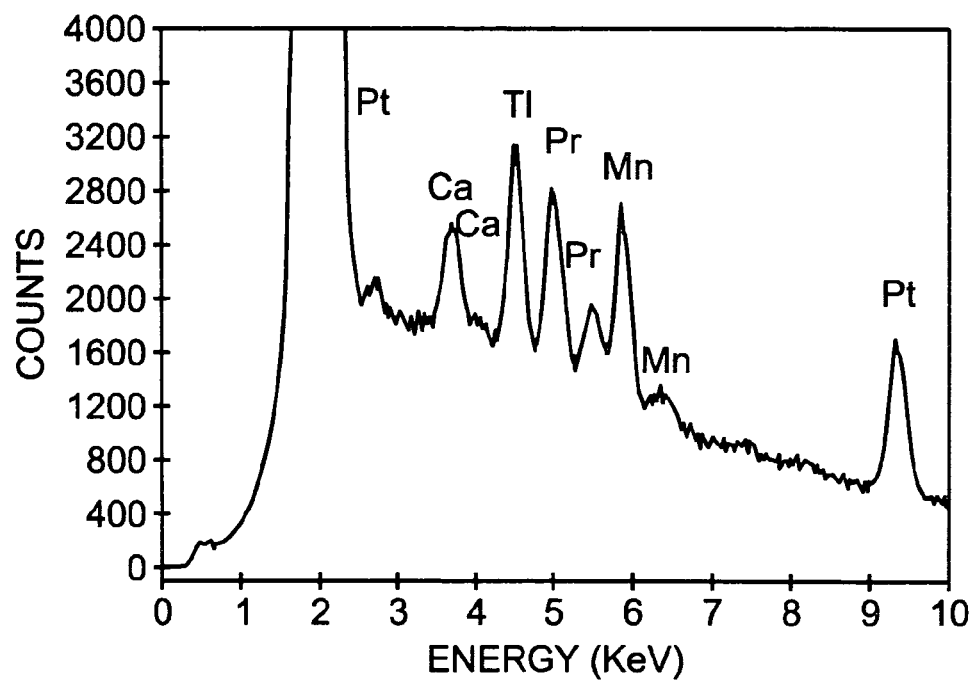
FIG. 3 is an EDX pattern of a PCMO thin film fabricated according to the method of the invention, after a post annealing step.

FIG. 2 depicts the EDX patterns of an as-deposited PCMO thin film, on a Pt/Ti/SiO$_2$/Si wafer, using the lower temperature deposition processes of the method of the invention. According to the Pr, Ca and Mn peaks, the PCMO composition is close to Pr$_{0.7}$Ca$_{0.3}$MnO$_3$. FIG. 3 depicts the EDX patterns of a PCMO thin film following a 700° C. anneal for about five minutes, again, on a Pt/Ti/SiO$_2$/Si wafer.

Figure 4:
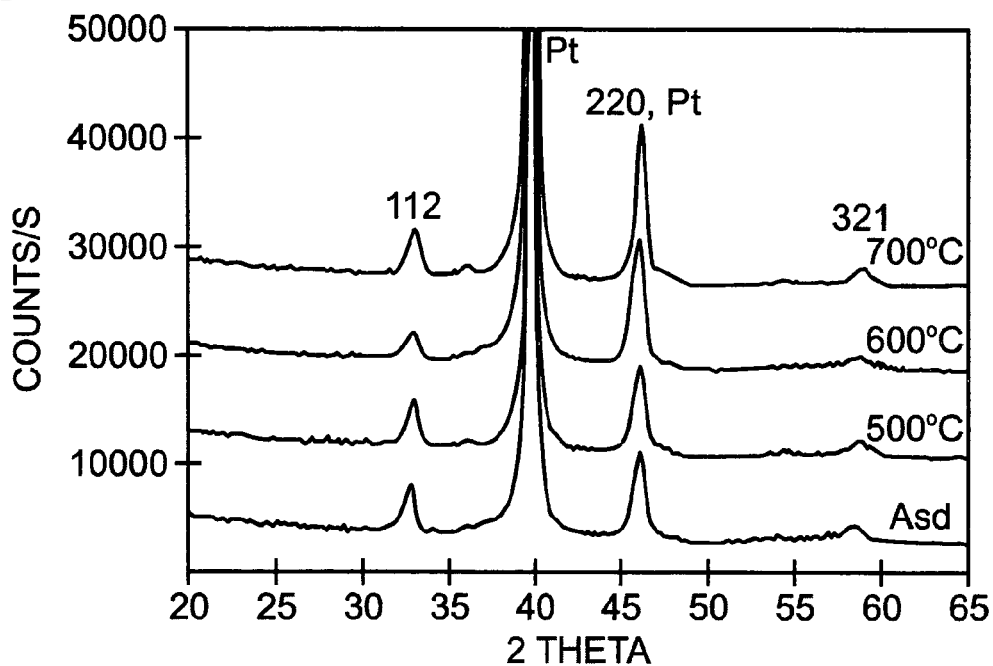
FIG. 4 is an X-ray pattern of a PCMO thin film fabricated according to the method of the invention.

FIG. 4 shows the x-ray patterns of PCMO thin films on Pt/Ti/SiO$_2$/Si wafers using lower temperature deposition and post deposition annealing processes of the method of the invention. As is shown in FIGS. 3 and 4, single-phase PCMO thin films having a weak c-axis orientation are formed.

Figure 5:
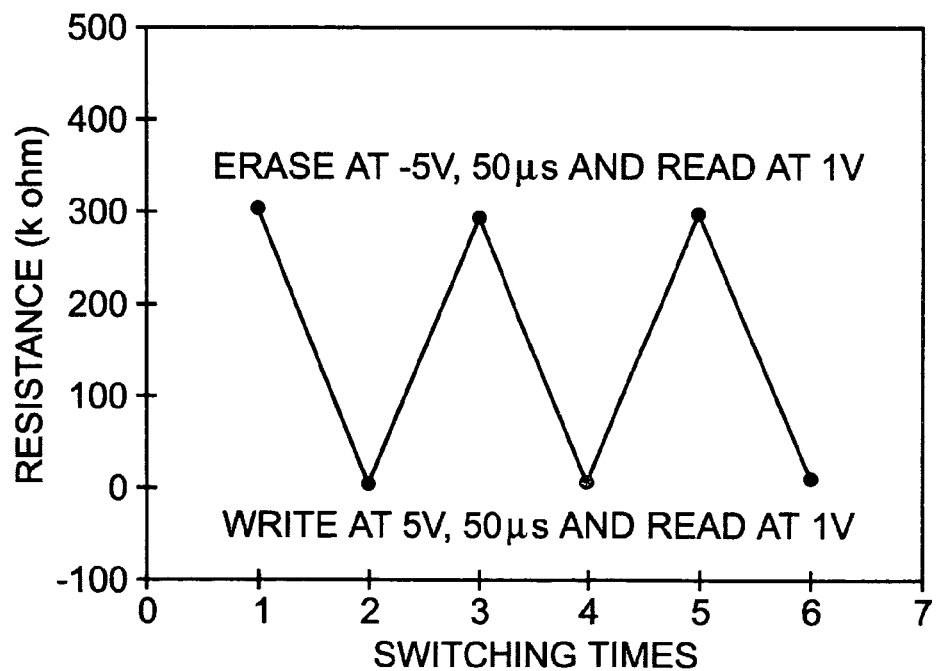
FIGS. 5 and 6 depicts bipolar switching properties of a PCMO thin film fabricated according to the method of the invention.
Figure 6:
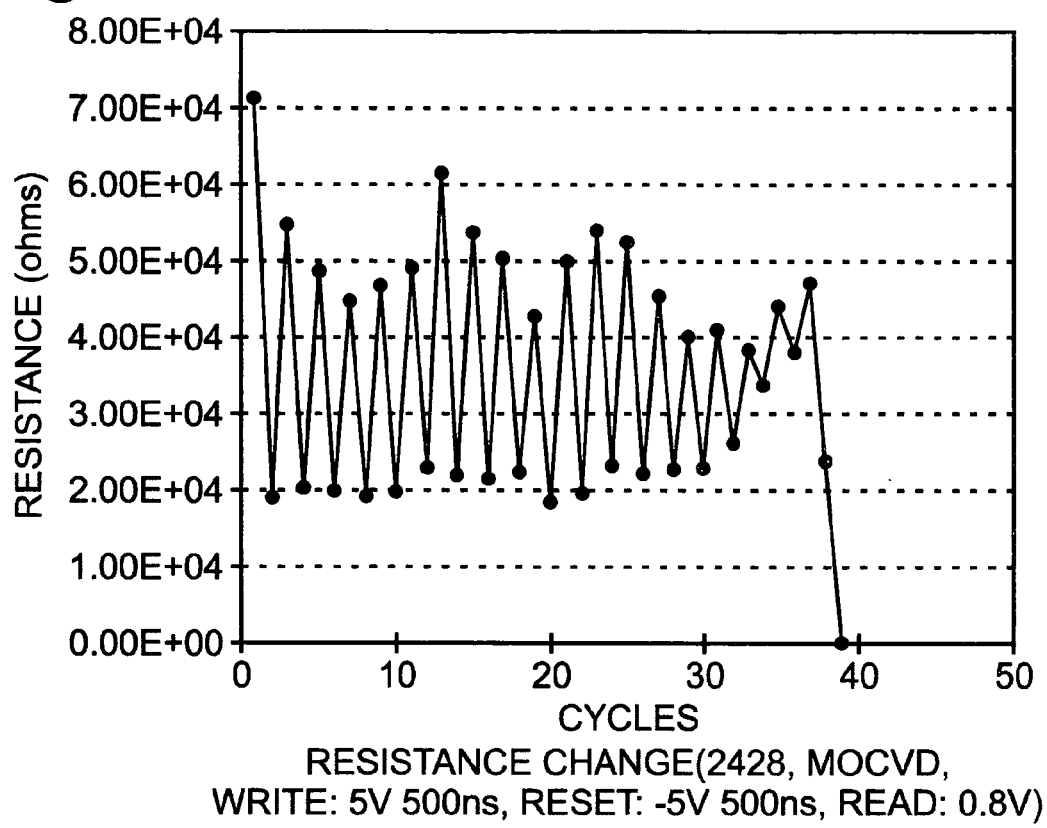

FIG. 5 shows the bipolar switching properties of PCMO thin films deposited on Pt/Ti/SiO$_2$/Si wafers using lower temperature deposition processes and programmed with relatively long pulses. As is shown in FIG. 4, the ratio of higher resistance to lower resistance is about two orders of magnitude. FIG. 6 shows the bipolar switching properties of PCMO thin films deposited on Pt/Ti/SiO$_2$/Si wafers using lower temperature deposition processes and programmed with relatively short pulses.

Figure 7:
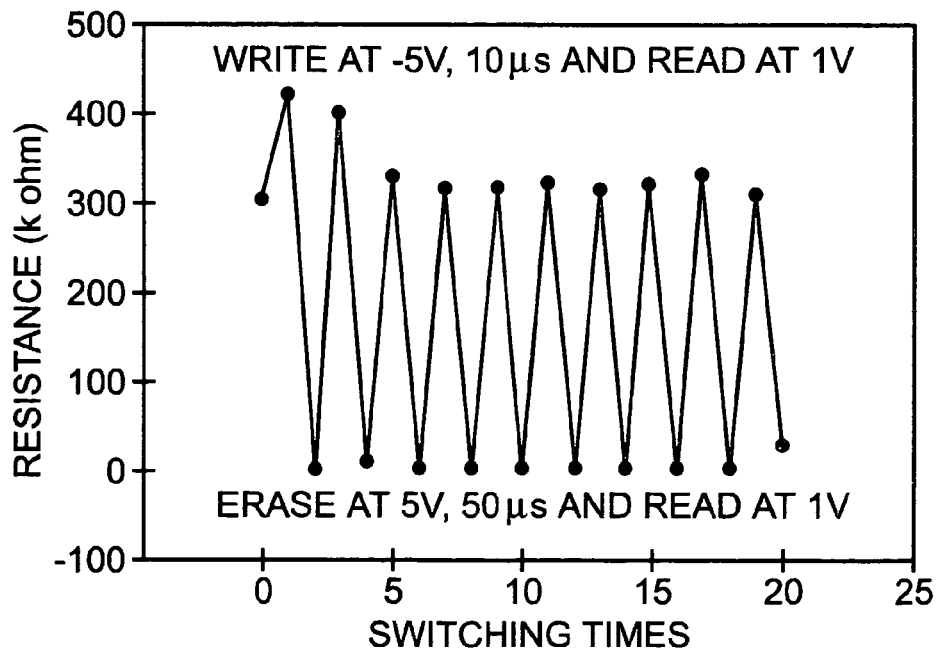
FIG. 7 depicts bipolar switching properties of a PCMO thin film fabricated according to the method of the invention after a post deposition annealing step.

FIG. 7 depicts bipolar switching properties of PCMO thin films deposited on Pt/Ti/SiO$_2$/Si wafers, after annealing at about 500° C. for about five minutes. In the case of PCMO thin films annealed at a temperature exceeding 600° C., nearly all samples evidenced short circuits, while the PCMO thin films annealed at temperature below 600° C. did not exhibit this defect. After annealing at temperatures exceeding 500° C. for 5 minutes, the PCMO thin films demonstrated the improved switching characteristics, shown in FIG. 7.

Figure 8:
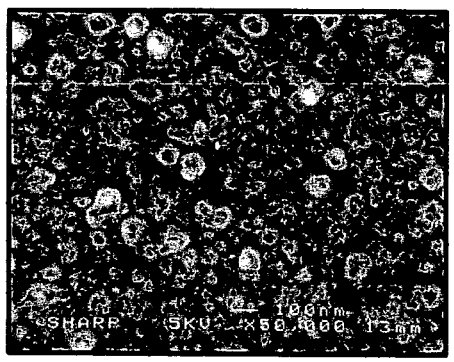
FIGS. 8 to 11 are microphotographs of a PCMO thin film fabricated according to the method of the invention.
Figure 9:
Figure 10:
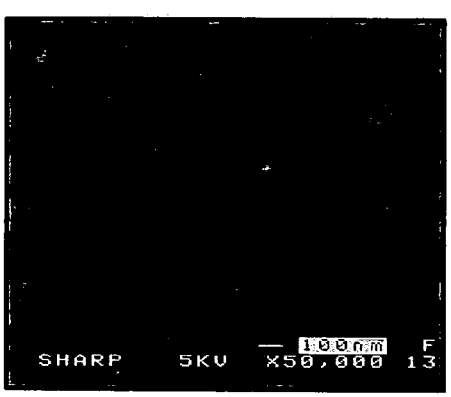
Figure 11:
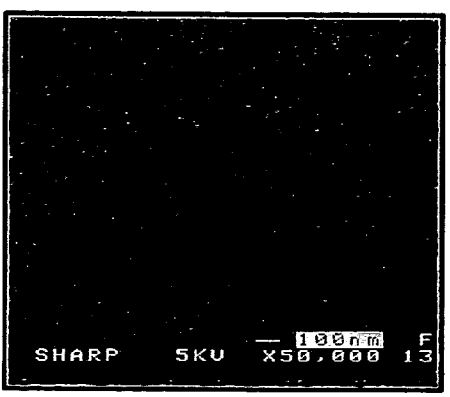

FIGS. 8 to 11 depict microstructures of PCMO thin films fabricated using the low-temperature deposition method of the invention. FIG. 8 depicts an as-deposited PCMO thin film. FIG. 9 depicts a PCMO thin film after annealing at about 500° C. for about five minutes. FIG. 10 depicts a PCMO thin film after annealing at about 600° C. for about five minutes, and FIG. 11 depicts a PCMO thin film after annealing at about 700° C. for about five minutes.

Thus, low temperature MOCVD processes for fabrication of Pr$_x$Ca$_{1-x}$MnO$_3$ thin films have been disclosed. It will be appreciated that further variations and modifications thereof may be made within the scope of the invention as defined in the appended claims.

We claim:

1. A method of fabricating a PCMO thin film at low temperature for use in a RRAM device, comprising:
    preparing a PCMO precursor;
    preparing a substrate;
    placing the substrate into a MOCVD chamber;
    introducing the PCMO precursor into the MOCVD chamber to deposit a PCMO thin film on the substrate;
    maintaining a MOCVD vaporizer at between about 240° C. to 280° C. and maintaining the MOCVD chamber at a temperature of between about 300° C. to 400° C.;
    removing the PCMO thin-film bearing substrate from the MOCVD chamber; and
    completing the RRAM device.

2. The method of claim 1 wherein said preparing a PCMO precursor includes dissolving solid organometallic compounds including Pr(thd)$_3$ Ca(thd)$_2$, Mn(thd)$_3$, where thd is C$_{11}$H$_{19}$O$_2$, in organic solvents butylether and tetraglyme, wherein a 1N metal of each Pr(thd)$_3$ Ca(thd)$_2$, Mn(thd)$_3$ has a ratio of between about 0.9:0.6:1, and are separately dissolved in a mixed solvent of butyl ether and tetraglyme in the volume ratio of 3:1, resulting in a precursor solution having a concentration of 0.1 M/L of metals for each of the Pr, Ca and Mn precursors.

3. The method of claim 1 wherein said preparing a substrate includes preparing a substrate taken from the group of substrates consisting of Pt/Ti/SiO$_2$/Si and Ir/Ti/SiO$_2$/Si, and dip etching the selected substrate in HF having a 50:1 dilution with water for about 20 seconds.

4. The method of claim 1 wherein the MOCVD chamber is maintained with an oxygen partial pressure of between about 20% to 30%, the temperature of the feed line is set between about 240° C. to 280° C., the pressure in the deposition chamber is maintained at between about 1 torr. to 5 torr, and wherein the precursor solution has a delivery rate, into the MOCVD chamber of between about 0.1 ml/min to 0.5 ml/min, for a deposition process time of between about 20 minutes to 60 minutes.

5. The method of claim 1 which includes annealing the PCMO thin film at a temperature of between about 500° C. to 600° C. for about five minutes.

6. A method of fabricating a nucleated PCMO thin film at low temperature for use in a RRAM device, comprising:
    preparing a PCMO precursor, including dissolving solid organometallic compounds including Pr(thd)$_3$ Ca(thd)$_2$, Mn(thd)$_3$, where thd is C$_{11}$H$_{19}$O$_2$, in organic solvents butylether and tetraglyme, wherein a 1N metal of each Pr(thd)$_3$ Ca(thd)$_2$, Mn(thd)$_3$ has a ratio of between about 0.9:0.6:1, and are separately dissolved in a mixed solvent of butyl ether and tetraglyme in the volume ratio of 3:1, resulting in a precursor solution having a concentration of 0.1 M/L of metals for each of the Pr, Ca and Mn precursors;
    preparing a substrate;
    placing the substrate into a MOCVD chamber;
    introducing the PCMO precursor into the MOCVD chamber to deposit a PCMO thin film on the substrate;
    maintaining a MOCVD vaporizer at between about 240° C. to 280° C. and maintaining the MOCVD chamber at a temperature of between about 300° C. to 400° C.;
    annealing the PCMO thin film at a temperature of between about 500° C. to 600° C. for about five minutes;
    removing the nucleated PCMO thin-film bearing substrate from the MOCVD chamber; and
    completing the RRAM device.

7. The method of claim 6 wherein said preparing a substrate includes preparing a substrate taken from the group of substrates consisting of Pt/Ti/SiO$_2$/Si and Ir/Ti/SiO$_2$/Si, and dip etching the selected substrate in HF having a 50:1 dilution with water for about 20 seconds.

8. The method of claim 6 wherein the MOCVD chamber is maintained with an oxygen partial pressure of between about 20% to 30%, the temperature of the feed line is set between about 240° C. to 280° C., the pressure in the deposition chamber is maintained at between about 1 torr. to 5 torr, and wherein the precursor solution has a delivery rate, into the MOCVD chamber of between about 0.1 ml/min to 0.5 ml/min, for a deposition process time of between about 20 minutes to 60 minutes.

9. A method of fabricating a PCMO thin film at low temperature for use in a RRAM device, comprising:
preparing a PCMO precursor;
preparing a substrate, including preparing a substrate taken from the group of substrates consisting of Pt/Ti/SiO$_2$/Si and Ir/Ti/SiO$_2$/Si, and dip etching the selected substrate in HF having a 50:1 dilution with water for about 20 seconds;
placing the substrate into a MOCVD chamber;
introducing the PCMO precursor into the MOCVD chamber to deposit a PCMO thin film on the substrate;
maintaining a MOCVD vaporizer at between about 240° C. to 280° C. and maintaining the MOCVD chamber at a temperature of between about 300° C. to 400° C., wherein the MOCVD chamber is maintained with an oxygen partial pressure of between about 20% to 30%, the temperature of the feed line is set between about 240° C. to 280° C., the pressure in the deposition chamber is maintained at between about 1 torr. to 5 torr, and wherein the precursor solution has a delivery rate, into the MOCVD chamber of between about 0.1 ml/min to 0.5 ml/min, for a deposition process time of between about 20 minutes to 60 minutes;
annealing the PCMO thin film at a temperature of between about 500° C. to 600° C. for about five minutes;
removing the PCMO thin-film bearing substrate from the MOCVD chamber; and
completing the RRAM device.

10. The method of claim 9 wherein said preparing a PCMO precursor includes dissolving solid organometallic compounds including Pr(thd)$_3$ Ca(thd)$_2$, Mn(thd)$_3$, where thd is $C_{11}H_{19}O_2$, in organic solvents butylether and tetraglyme, wherein a 1N metal of each Pr(thd)$_3$ Ca(thd)$_2$, Mn(thd)$_3$ has a ratio of between about 0.9:0.6:1, and are separately dissolved in a mixed solvent of butyl ether and tetraglyme in the volume ratio of 3:1, resulting in a precursor solution having a concentration of 0.1 M/L of metals for each of the Pr, Ca and Mn precursors.

* * * * *